(12) United States Patent
Kim et al.

(10) Patent No.: US 11,208,320 B2
(45) Date of Patent: Dec. 28, 2021

(54) MEMS MICROPHONE, METHOD OF MANUFACTURING THE SAME AND MEMS MICROPHONE PACKAGE INCLUDING THE SAME

(71) Applicant: DB HITEK CO., LTD., Seoul (KR)

(72) Inventors: Dae Young Kim, Suwon-si (KR); Jin Hyung Lee, Seoul (KR)

(73) Assignee: DB HITEK CO., LTD., Seoul (KR)

( * ) Notice: Subject to any disclaimer, the term of this patent is extended or adjusted under 35 U.S.C. 154(b) by 75 days.

(21) Appl. No.: 16/510,456

(22) Filed: Jul. 12, 2019

(65) Prior Publication Data

US 2020/0017357 A1 Jan. 16, 2020

(30) Foreign Application Priority Data

Jul. 12, 2018 (KR) .................. 10-2018-0080929

(51) Int. Cl.
| | | |
|---|---|---|
| *B81B 7/00* | (2006.01) | |
| *H04R 19/04* | (2006.01) | |
| *H04R 1/28* | (2006.01) | |
| *B81B 3/00* | (2006.01) | |
| *B81C 1/00* | (2006.01) | |
| *H04R 7/04* | (2006.01) | |
| *H04R 19/00* | (2006.01) | |

(52) U.S. Cl.
CPC .......... *B81B 7/0061* (2013.01); *B81B 3/0021* (2013.01); *B81C 1/00158* (2013.01); *H04R 1/2823* (2013.01); *H04R 7/04* (2013.01); *H04R 19/005* (2013.01); *H04R 19/04* (2013.01); *B81B 2201/0257* (2013.01)

(58) Field of Classification Search
CPC ............... B81B 7/0061; B81B 3/0021; B81B 2201/0257; H04R 19/005; H04R 19/04; H04R 1/2823; H04R 7/04; H04R 31/003; B81C 1/00158
See application file for complete search history.

(56) References Cited

U.S. PATENT DOCUMENTS

| | | | |
|---|---|---|---|
| 2016/0094918 A1* | 3/2016 | Uchida | ................ H04R 19/016 381/120 |
| 2017/0311083 A1 | 10/2017 | Sun et al. | |
| 2017/0311088 A1 | 10/2017 | Sun et al. | |
| 2017/0311089 A1 | 10/2017 | Sun et al. | |
| 2017/0359648 A1 | 12/2017 | Park et al. | |

(Continued)

OTHER PUBLICATIONS

U.S. Appl. No. 16/103,074, filed May 3, 2019, Inventor(s) Min Hyun Jin et al.

*Primary Examiner* — Benjamin Tzu-Hung Liu
(74) *Attorney, Agent, or Firm* — Patterson Thuente Pedersen, P.A.

(57) ABSTRACT

A MEMS microphone includes a substrate defining a cavity including a first sidewall extending a vertical direction, a back plate disposed over the substrate and defining a plurality of acoustic holes, a diaphragm disposed between the substrate and the back plate, the diaphragm having at least one vent hole, an anchor extending from a circumference of the diaphragm to connect an end portion of the diaphragm to an upper surface of the substrate, and at least one path member communicating with the vent hole, the path member providing a flow path for the acoustic pressure to flow downwardly toward the cavity.

6 Claims, 6 Drawing Sheets

(56) References Cited

U.S. PATENT DOCUMENTS

| | | |
|---|---|---|
| 2019/0047849 A1 | 2/2019 | Park et al. |
| 2019/0052976 A1 | 2/2019 | Sun |
| 2019/0082269 A1 | 3/2019 | Sun |
| 2019/0082270 A1 | 3/2019 | Sun |
| 2019/0082271 A1 | 3/2019 | Kim et al. |
| 2020/0137501 A1* | 4/2020 | Piechocinski ......... B81B 7/0064 |

* cited by examiner

MEMS MICROPHONE, METHOD OF MANUFACTURING THE SAME AND MEMS MICROPHONE PACKAGE INCLUDING THE SAME

CROSS-REFERENCE TO RELATED APPLICATION

This application claims priority to Korean Patent Application No. 10-2018-0080929, filed on Jul. 12, 2018, and all the benefits accruing there from under 35 U.S.C. § 119, the contents of which are incorporated by reference in their entirety.

TECHNICAL FIELD

The present disclosure relates to a Micro Electro Mechanical Systems (MEMS) microphone capable of converting an acoustic wave into an electrical signal, a method of manufacturing the MEMS microphone, and a MEMS microphone package including the MEMS microphone. More particularly, the present disclosure relates a capacitive MEMS microphone being capable of transforming an acoustic wave into an electric signal using a displacement of a diaphragm which occurs due to an acoustic pressure, a method of manufacturing such a MEMS microphone, and a MEMS microphone package including such MEMS microphone.

BACKGROUND

Generally, a capacitive microphone utilizes a capacitance between a pair of electrodes which are facing each other to detect an acoustic wave. The capacitive microphone includes a diaphragm and a back plate. The diaphragm may respond to an acoustic pressure to be configured to be bendable. A back plate may face the diaphragm.

The diaphragm may have a membrane structure to perceive an acoustic pressure to generate a displacement. In particular, when the acoustic pressure is applied to the diaphragm, the diaphragm may be bent toward the back plate due to the acoustic pressure. The displacement of the diaphragm may be perceived through a value change of capacitance formed between the diaphragm and the back plate. As a result, an acoustic wave may be converted into an electrical signal for output.

The capacitive microphone may be manufactured by a semiconductor MEMS process such that the capacitive microphone has a MEMS type having an ultra-small size, which is referred as MEMS microphone. The diaphragm is spaced apart from a substrate including a cavity so that the diaphragm can be freely bent upwardly or downwardly in accordance with the acoustic pressure. The MEMS microphone has an anchor provided at a peripheral portion of the diaphragm. The anchor makes contact with the substrate to stably support the diaphragm from the substrate.

Particularly, when the MEMS microphone is applied not only to a mobile device but also to a voice recognition device, a signal-to-noise ratio (hereinafter referred to as "SNR") may be required to be more than 65 dB. In order to achieve a relatively high SNR, the MEMS microphone may have to improve noise characteristics.

The noise characteristics of the MEMS microphone may be mainly determined by a thermal noise which may serve as sources of an acoustic noise, a mechanical noise, an electrical noise, etc. The thermal noise may be also converted into electrical signals. Therefore, in order to improve the noise characteristics of the MEMS microphone, it may be necessary to improve the energy domains of acoustic, mechanic and electric components as well as the conversion characteristics of acoustic-mechanical and mechanical-electrical systems.

Therefore, it is possible to simultaneously improve the overall noise component and the conversion characteristics of the MEMS microphones.

SUMMARY

The embodiments described herein provide a MEMS microphone capable of simultaneously improving the overall noise component and the conversion characteristics.

The embodiments described herein provide a method of manufacturing a MEMS microphone capable of simultaneously improving the overall noise component and the conversion characteristics.

The embodiments described herein provide a MEMS microphone package including a MEMS microphone capable of simultaneously improving the overall noise component and the conversion characteristics.

According to an embodiment of the present invention, a MEMS microphone includes a substrate defining a cavity including a first sidewall extending a vertical direction, a back plate disposed over the substrate and defining a plurality of acoustic holes, a diaphragm disposed between the substrate and the back plate, the diaphragm being spaced apart from the substrate and the back plate to cover the cavity, the diaphragm having at least one vent hole, and being configured to sense an acoustic pressure to generate a corresponding displacement, an anchor extending from a circumference of the diaphragm to connect an end portion of the diaphragm to an upper surface of the substrate, the anchor being connected with the upper surface of the substrate to support the diaphragm, and at least one path member communicating with the vent hole, the path member providing a flow path for the acoustic pressure to flow downwardly toward the cavity.

In an example embodiment, a first acoustic resistance defined by the vent hole and the path member may be larger than a second acoustic resistance defined by the acoustic holes.

In an example embodiment, there are a plurality of vent holes and path members, and vent holes and the path members are arranged along a circumference of the diaphragm.

In an example embodiment, the vent hole and the path member overlap one another.

In an embodiment, the path member extends in a vertical direction.

In an embodiment, the anchor is positioned on an upper surface of the substrate and surrounds the cavity, and the path member extends along an inner sidewall of a penetration hole which is connected to the anchor and penetrates through the substrate.

Here, the substrate further includes a cavity extending portion extending outwardly from a center line thereof.

Further, the cavity extending portion communicates with the path member.

According to an embodiment of the present invention a MEMS microphone is manufactured by forming an insulation layer on a substrate that is divided into a vibration area and a peripheral area surrounding the vibration area, patterning the insulation layer to form an anchor hole and a path hole for forming an anchor and a path member, respectively, in the peripheral area, the anchor hole and the path hole extending along a circumference of the vibration area, forming a diaphragm, an anchor, and a path member on the insulation layer through which the anchor hole and the path hole are formed, the anchor connecting the diaphragm to the substrate, forming a sacrificial layer on the insulation layer to cover the diaphragm and the anchor, forming a back plate on the sacrificial layer to face the diaphragm, patterning the back plate to form a plurality of acoustic holes which each penetrate through the back plate, patterning the substrate to form a cavity defined by a first sidewall in the vibration area, removing a portion of the insulation layer, which is located under the diaphragm, through an etching process using the cavity as a mask, and removing a portion of the sacrificial layer, which corresponds to the diaphragm and the anchor.

In an embodiment, the anchor hole is formed in a ring shape to surround the vibration area, the method may further include forming the diaphragm by forming a plurality of vent holes and a plurality of path holes in the peripheral area, and removing the portion of the sacrificial layer via a flow path passing through the plurality of vent holes and the plurality of path holes.

According to an embodiment, a MEMS microphone package includes a substrate defining a cavity with a first sidewall extending a vertical direction, a back plate disposed over the substrate and defining a plurality of acoustic holes, a diaphragm disposed between the substrate and the back plate, the diaphragm being spaced apart from the substrate and the back plate to cover the cavity, the diaphragm having at least one vent hole, and being configured to sense an acoustic pressure to generate a corresponding displacement, an anchor extending from a circumference of the diaphragm to connecting an end portion of the diaphragm to an upper surface of the substrate, the anchor being connected with the upper surface of the substrate to support the diaphragm, at least one path member communicating with the vent hole, the path member providing a flow path for the acoustic pressure to flow downwardly toward the cavity and a package portion entirely surrounding the substrate, the back plate, the diaphragm, the anchor and the path member, the package portion including a bottom port which provides a flow path for an acoustic pressure.

In an embodiment, a first acoustic resistance defined by the vent hole and the path member may be larger than a second acoustic resistance defined by the acoustic holes.

In an embodiment, there are a plurality of vent holes and path members, and the vent holes and the path members are arranged along a circumference of the diaphragm.

In an example embodiment, the vent hole and the path member overlap one another.

In an embodiment, the path member extends in a vertical direction.

In an embodiment, the anchor is positioned on an upper surface of the substrate and surrounds the cavity, and the path member extends along a inner sidewall of a penetration hole which is connected to the anchor and penetrates through the substrate.

Here, the substrate further includes a cavity extending portion extending outwardly from a center line thereof.

Further, the cavity extending portion communicates with the path member.

According to embodiments of the present invention as described herein, the MEMS microphone includes the path member communicating with the vent hole. The path member transmits the acoustic pressure to the cavity via the vent hole. The path member may serve as an acoustic resistance. That is, the path member increases the flow path of air discharged from the air gap AG. Accordingly, the SNR may be improved by increasing the acoustic resistance.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Exemplary embodiments can be understood in more detail from the following description taken in conjunction with the accompanying drawings, in which.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF EMBODIMENTS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. Unlike this, it will also be understood that when a layer, a film, a region or a plate is referred to as being 'directly on' another one, it is directly on the other one, and one or more intervening layers, films, regions or plates do not exist. Also, though terms like a first, a second, and a third are used to describe various components, compositions, regions and layers in various embodiments of the present invention are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations. Similarly, the term "vertical" is used throughout the application to refer to the orientation shown in the drawings. It should be understood that MEMS microphones are often oriented at a variety of angles and positions and need not be fixed in one orientation relative to a gravitational "vertical" direction—rather, "vertical" refers generally to the direction orthogonal to the back plate or undeflected substrate structures.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

Figure 1:
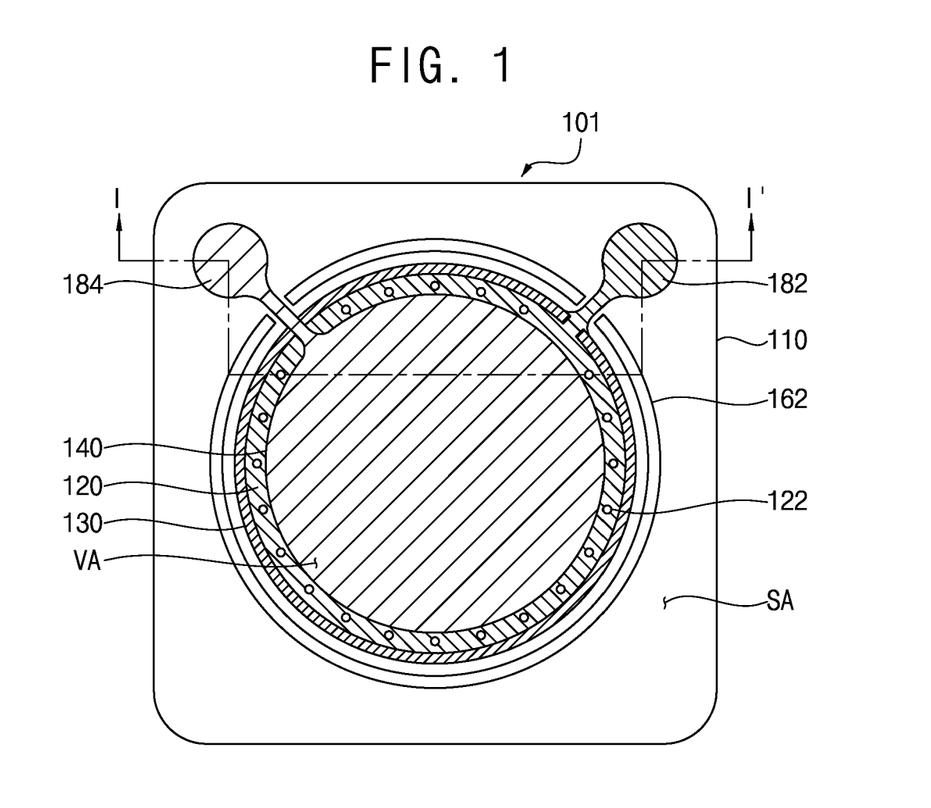
FIG. 1 is a plan view illustrating a MEMS microphone in accordance with an embodiment of the present invention.
Figure 2:
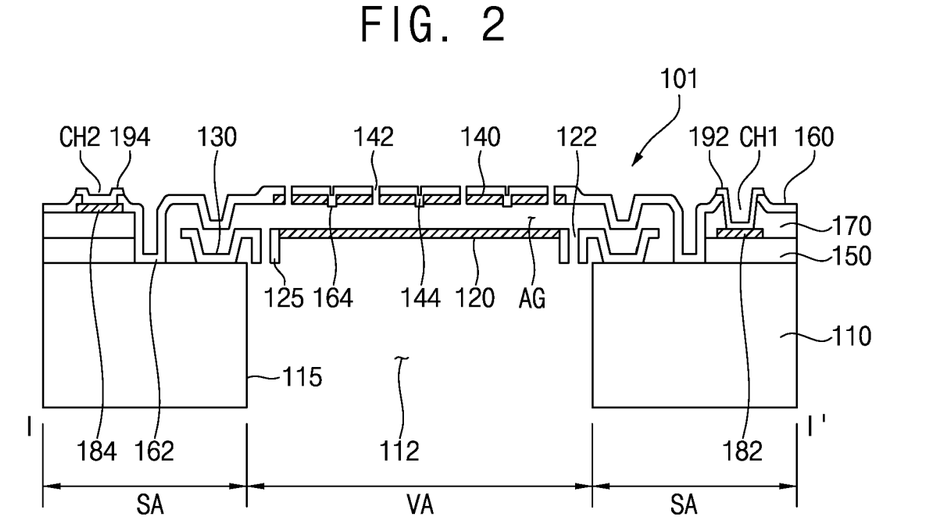
FIG. 2 is a cross sectional view taken along a line I-I' in FIG. 1.

FIG. 1 is a plan view illustrating a MEMS microphone in accordance with an embodiment of the present invention. FIG. 2 is a cross sectional view taken along a line I-I' in FIG. 1.

Referring to FIGS. 1 and 2, a MEMS microphone 101 in accordance with an example embodiment of the present invention includes a substrate 110, a diaphragm 120, an anchor 130, a back plate 140 and a path member 125. The MEMS microphone 101 is capable of generating a displacement in response to an acoustic pressure to convert an acoustic signal into an electrical signal and output the electrical signal.

The substrate 110 is divided into a vibration area VA and a peripheral area SA. In the vibration area VA, a cavity 112 penetrating through the substrate in a vertical direction is formed.

In an example embodiment, a first sidewall 115 may define the cavity 112. The first sidewall 115 extends along a vertical direction. The vibration area VA may correspond to the cavity 112.

The diaphragm 120 may have a membrane structure. The diaphragm 120 may be positioned over the substrate 110 to cover the cavity 112, and the diaphragm 120 may be exposed to the cavity 112. The diaphragm 120 is spaced apart from the substrate 110 to be configured to be bendable in response to an acoustic pressure. The diaphragm 120 may have an ion implantation region into which impurities such as type III or V elements are doped. The ion implantation region may correspond to the vibration area VA.

In an example embodiment, the diaphragm 120 may have a shape of a disc or a plate, as shown in FIG. 1, and the cavity 112 may have a circular or cylindrical shape.

In an embodiment, the diaphragm 120 may have a plurality of vent holes 122. The vent holes 122 may serve as a path for the acoustic wave which flows between the air gap AG and the cavity 112. Thus, the vent holes 122 may control a pressure balance between the cavity 112 and the air gap AG. Further, the vent holes 122 may prevent the diaphragm 120 from being damaged by the acoustic pressure applied externally to the diaphragm 120.

The vent holes 122 are positioned along the peripheral area SA. The vent holes 122 may be arranged inside along the anchor 130 and may be spaced apart from one another, as shown in FIG. 1. The vent holes 122 may penetrate through the diaphragm 120, as shown in FIG. 2.

The anchor 130 is positioned at an end portion of the diaphragm 120. The anchor 120 supports the diaphragm 120 which is spaced apart from the substrate 110.

The anchor 130 is positioned in the peripheral area SA of the substrate 110. The anchor 130 may have a lower face to make contact with an upper face of the substrate 110. The anchor 130 may extend along a circumference of the diaphragm 120 to surround the vibration area VA.

In an example embodiment of the present invention, the anchor 130 may have a ring shape. The anchor may have a dam shape: that is, a section of the anchor 130 along the vertical direction may have a U-shape, as shown in FIG. 2.

The back plate 140 may be positioned over the diaphragm 120 as shown in FIG. 2. The back plate 140 may be disposed in the vibration area VA. The back plate 140 is spaced apart from the diaphragm 120 and faces the diaphragm 120. Like the diaphragm 120, the back plate 140 may have a disc shape.

The back plate 140 may be spaced apart from the diaphragm 120 to form the air gap AG.

A plurality of acoustic holes 142 is formed through the back plate 140 and the second insulation layer 160 such that acoustic pressure passes through the acoustic holes 142. The acoustic holes 142 penetrate through the back plate 140 and the second insulation layer 160, and may communicate with the air gap AG.

Each of the path members 125 communicates with each of the vent holes 122. The path members 125 provide a flow path so that the acoustic pressure may flow downwardly toward the cavity 112. Each of the path members 125 may extend vertically.

The path members 125 transmit the acoustic pressure to the cavity 112 via the vent holes 122. The path members 125 may function as an acoustic resistance body. That is, the path members 125 increase the flow path of air discharged from the air gap AG. As a result, the SNR may increase as the acoustic resistance increases. For example, when the MEMS microphone 101 is employed in the bottom port typed MEMS microphone package, the SNR may reach 65 dB or more. Therefore, the MEMS microphone 101 may be applied to a voice recognition device.

A first acoustic resistance value defined by the vent hole 112 and the path members 125 may be larger than a second acoustic resistance value defined by the acoustic hole. As a result, the SNR may be increased.

The vent hole 122 and the path members 125 may be arranged along an outer periphery of the diaphragm 120. As a result, the time for which air remains in the air gap AG may be relatively increased, so that the SNR and the sensitivity may be improved.

In some example embodiments, such as the embodiment shown in FIG. 2, the MEMS microphone 101 may further include a first insulation layer 150, a second insulation layer 160, an insulating interlayer 170, a diaphragm pad 182, a back plate pad 184, a first pad electrode 192 and a second pad electrode 194.

In particular, the first insulation layer 150 may be formed on the upper surface of the substrate 110 and may be located in the peripheral area SA.

The second insulation layer 160 may be disposed over the substrate 110. The second insulation layer 160 may cover a top surface of the back plate 140. The second insulation layer 160 may include a portion bent from outside of the back plate 140 to form a chamber portion 162 having a section of a "U" shape. The chamber portion 162 may be located in the peripheral area SA.

As shown in FIG. 1, the chamber portion 162 may be spaced apart from the anchor 130 and may have a ring shape so as to surround the anchor 130. The second insulation layer 160 is spaced apart from the diaphragm 120 and the anchor 130 to additionally form the air gap AG between the diaphragm 120 and the back plate 140. Therefore, the air gap AG may have an increased volume.

The chamber portion 162 makes contact with the upper surface of the substrate 110 such that the second insulation layer 160 having the chamber portion 162 may support the back plate 140 which is coupled to a lower face of the second insulation layer 160. As a result, the back plate 140 may be kept apart from the diaphragm 120 to maintain the air gap AG.

A plurality of acoustic holes 142 is formed through the back plate 140 and the second insulation layer 160 such that acoustic pressure passes through the acoustic holes 142. The acoustic holes 142 penetrate through the back plate 140 and the second insulation layer 160 and may communicate with the air gap AG.

In an example embodiment, the back plate 140 may have a plurality of dimple holes 144, and the second insulation layer 160 may have a plurality of dimples 164 positioned to correspond to those of the dimple holes 144. The dimple holes 144 penetrate through the back plate 140, and the dimples 164 are provided at positions where the dimple holes 144 are formed.

The dimples 164 may prevent the diaphragm 120 from being coupled to a lower face of the back plate 140. That is, when sound reaches the diaphragm 120, the diaphragm 120 can be bent in a semicircular shape toward the back plate 140, and then can return to its initial position. A bending degree of the diaphragm 120 may vary depending on the sound pressure and may be increased to such an extent that an upper face of the diaphragm 120 makes contact with the lower face of the back plate 140. When the diaphragm 120 is bent so much as to contact the back plate 140, the diaphragm 120 may attach to the back plate 140 and may not return to the initial position.

According to some embodiments, the dimples 164 may protrude from the lower face of the back plate 140 toward the diaphragm 120. Even when the diaphragm 120 is severely bent (e.g., so much that the diaphragm 120 contacts the back plate 140), the dimples 164 separate the diaphragm 120 and the back plate 140 from one another so that the diaphragm 120 can return to the initial position rather than becoming stuck in contact with one another more permanently.

The diaphragm pad 182 may be formed on the upper face of the first insulation layer 150. The diaphragm pad 182 may be electrically connected to the diaphragm 120.

The insulating interlayer 170 may be formed on the first insulation layer 150 having the diaphragm pad 182. The insulating interlayer 170 is disposed between the first insulation layer 150 and the second insulation layer 160, and is located in the peripheral area SA. Here, the first insulation layer 150 and the insulating interlayer 170 may be located outside from the chamber portion 162, as shown in FIG. 2.

The back plate pad 184 may be formed on an upper face of the insulating interlayer 170. The back plate pad 184 is electrically connected to the back plate 140 and may be located in the peripheral area SA.

The diaphragm pad 182 is exposed through a first contact hole CH1 formed by partially removing the second insulation layer 160 and the insulating interlayer 170. The back plate pad 184 is exposed through a second contact hole CH2 formed by partially removing the second insulation layer 160.

The first and second pad electrodes 192 and 194 may be formed on the second insulation layer 160. The first pad electrode 192 is located in the first contact hole CH1 to make contact with the diaphragm pad 182. On the other hand, the second pad electrode 194 is located in the second contact hole CH2 and makes contact with the back plate pad 184. Here, the first and second pad electrodes 192 and 194 may be transparent electrodes.

Figure 3:
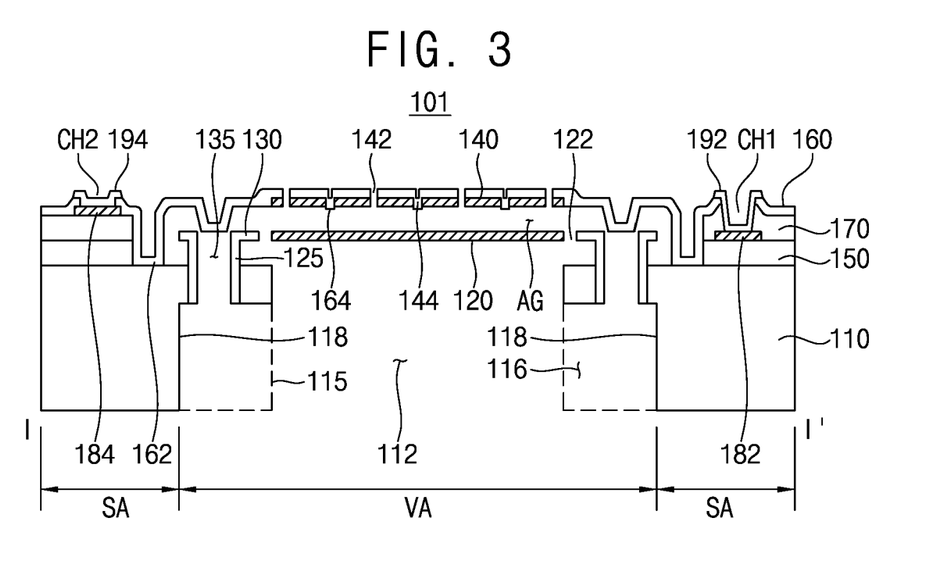
FIG. 3 is a cross sectional view illustrating a MEMS microphone in accordance with an embodiment of the present invention.

FIG. 3 is a cross sectional view illustrating a MEMS microphone 101 in accordance with an embodiment of the present invention. Throughout the application, the same reference numeral will be used to refer to components that are substantially similar to one another in the various drawings.

Referring to FIG. 3, a MEMS microphone 101 in accordance with an example embodiment of the present invention includes a substrate 110, a diaphragm 120, an anchor 130, a back plate 140, a path member 125 and a cavity extending portion 116. Throughout the application, the same reference numeral will be used to refer to components that are substantially similar to one another in the various drawings.

The substrate 110 includes a cavity 112, the cavity extending portion 116 communicating with the cavity 112, and a plurality of penetration holes 135.

The cavity extending portion 116 may be formed by removing a lower portion of the substrate 110 adjacent to a lower portion of a first sidewall 115 to communicate with a lower portion of the cavity 112. On the other hand, an upper portion of the substrate 110 may still remain on the cavity extending portion 116 to surround an upper portion of the first sidewall 115 of the cavity 112. The upper portion of the substrate 110 may provide an area for positioning the anchor 130.

Accordingly, the cavity extending portion 116 communicates with the lower portion of the cavity 112. As a result, the cavity extending portion 116 and the cavity 112 may enlarge a volume of a space, which is defined by cavity extending portion 116 and the cavity 112.

When the MEMS microphone 101 is implemented in a MEMS microphone package having a top port structure, the space defined by the cavity 112 and the cavity extending portion 116 functions as the back chamber. As the volume of the back chamber is increased, the SNR value may increase while reducing the compliance.

The penetration holes 135 are formed through the remained upper portion of the substrate 110 to communicate with the cavity extension portion 116. The penetration holes 135 are arranged along the remained upper portion of the substrate 110 so as to surround the upper portion of the cavity 112.

The anchor 130 is formed along the remained upper surface of the substrate 110. That is, the anchor 130 makes contact with the remained upper surface of the substrate 110. Thus, the anchor 130 may support the diaphragm 120 with respect to the substrate 110. Further, the penetration holes 135 may penetrate through a bottom portion of the anchor 130 at various positions.

The path member 122 extends along one of inner sidewalls of the penetration holes 135. The path member 122 provides a path through which air may be discharged from the air gap AG. The path member 122 is in communication with the cavity extension portion 116.

Accordingly, the MEMS microphone 101 including the cavity extending portion 116 and the path member 125 may have an improved SNR.

Hereinafter, a method of manufacturing a MEMS microphone will be described in detail with reference to the drawings.

Figure 4:
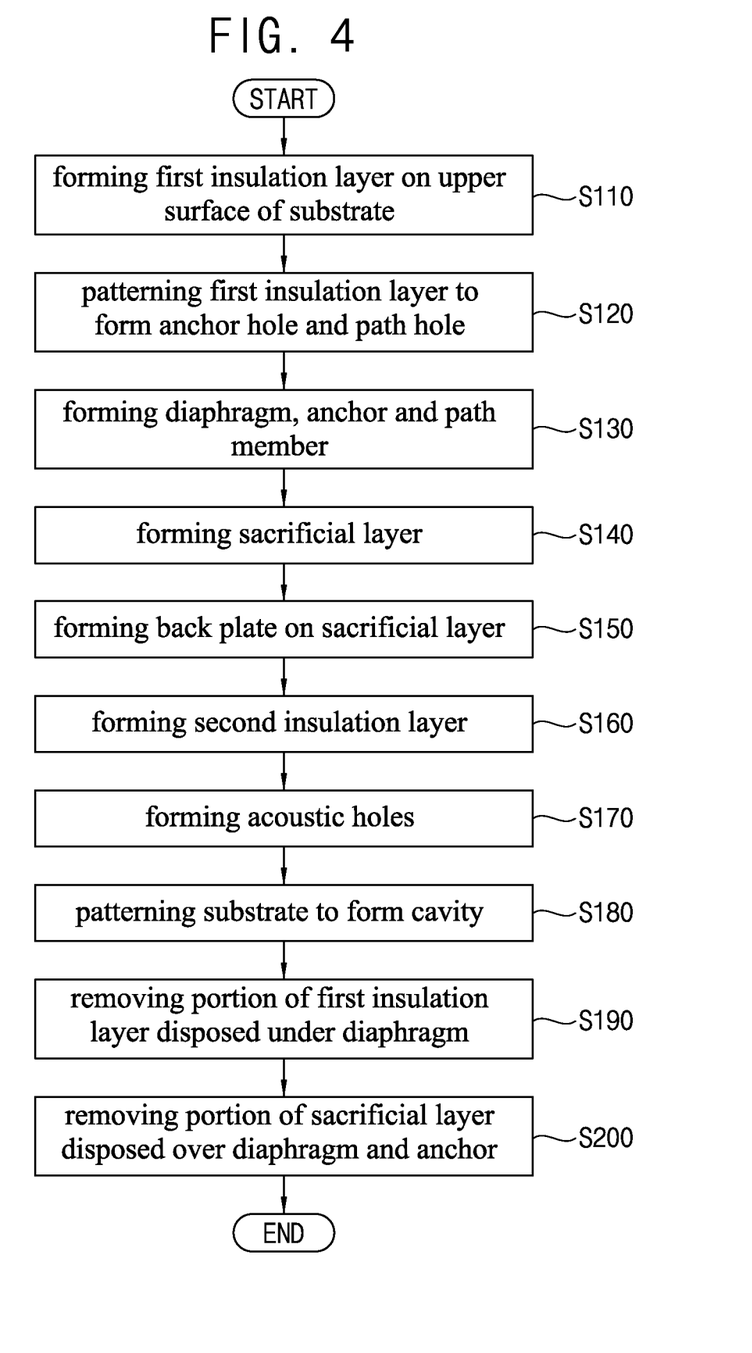
FIG. 4 is a flow chart illustrating a method of manufacturing a MEMS microphone in accordance with an embodiment of the present invention.
Figure 5:
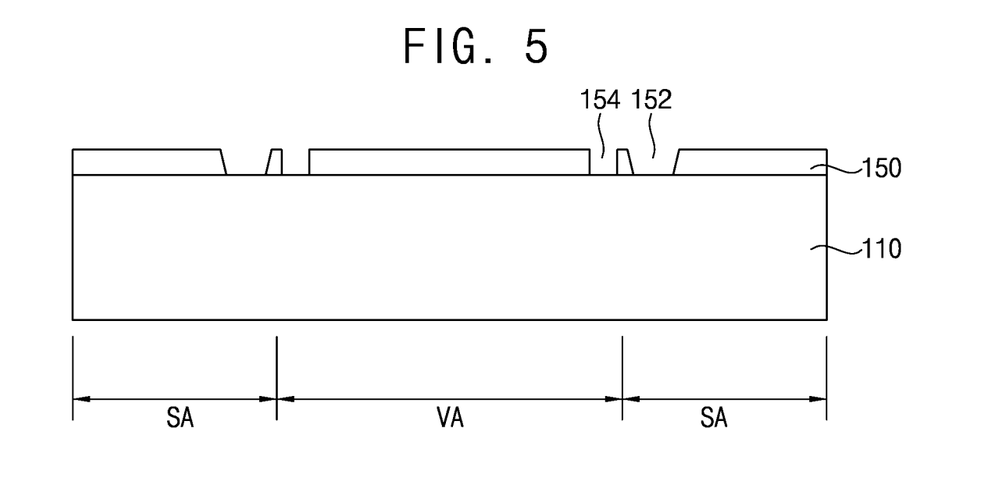
FIGS. 5, 7 and 8 are cross sectional views illustrating a method of manufacturing a MEMS microphone in accordance with an embodiment of the present invention.
Figure 6:
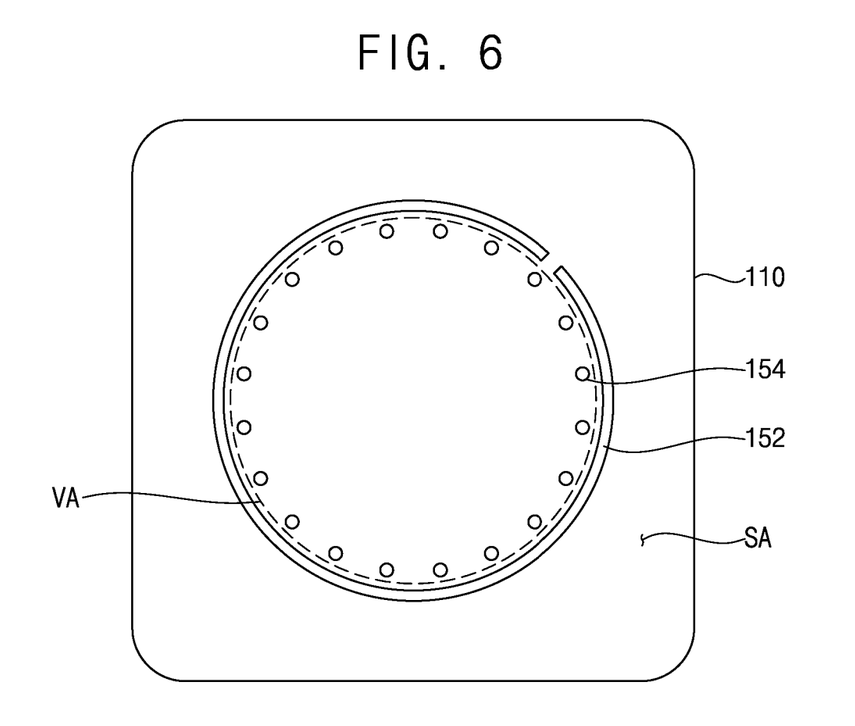
FIG. 6 is a plan view illustrating the first insulation layer in FIG. 5.
Figure 7:
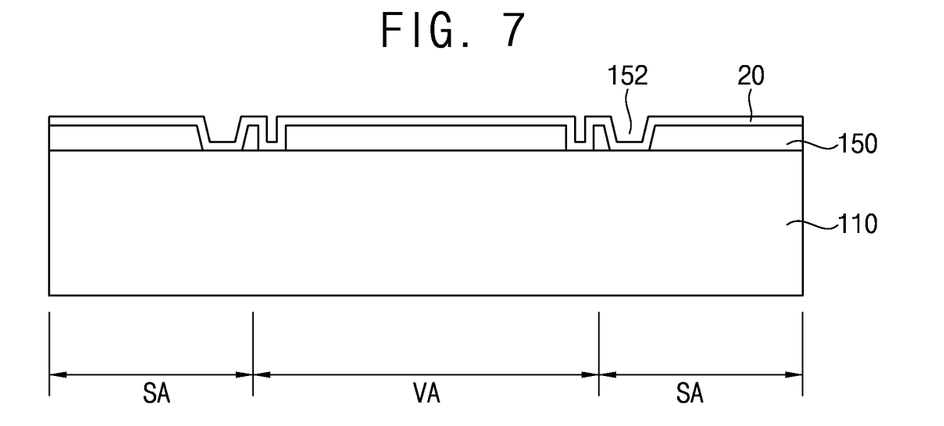
Figure 8:
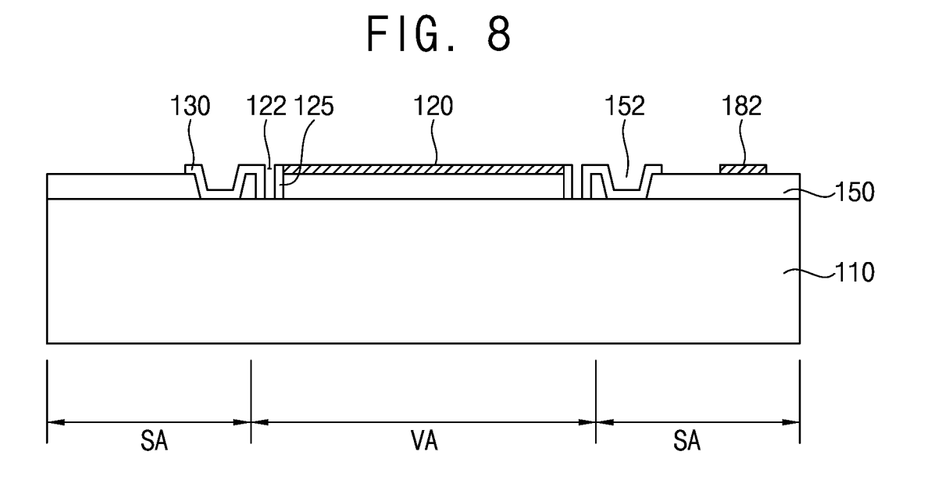

FIG. 4 is a flow chart illustrating a method of manufacturing a MEMS microphone in accordance with an example embodiment of the present invention. FIGS. 5, 7 and 8 are cross sectional views illustrating a method of manufacturing a MEMS microphone in accordance with an example embodiment of the present invention. FIG. 6 is a plan view illustrating the first insulation layer in FIG. 5.

Referring to FIGS. 4 to 6, according to an example embodiment of a method for manufacturing a MEMS microphone, a first insulation layer 150 is formed on a substrate 110 (at S110).

Next, the first insulation layer 150 is patterned to form one anchor hole 152 for forming the anchor 130 and a plurality of path holes 154 for forming the path members 125 (see FIG. 2) (at S120).

The anchor hole 152 may be formed in the peripheral area SA and the substrate 110 may be partially exposed through the anchor hole 152. The anchor hole 152 extends along a circumference of a vibration area VA, as shown in FIG. 5, and may be formed in a ring shape to surround the vibration area VA. Since the anchor hole 152 extends along the circumference of the vibration area VA, the anchor 130 may be formed in a dam shape in a subsequent step.

Further, the path holes 154 are arranged along a circumference of the vibration area VA. The path holes 154 are formed at positions for forming the path members 125 (see FIG. 6).

Referring to FIG. 7, a first silicon layer 20 is formed on the first insulation layer 150 having the anchor hole 152 and the path holes 154 formed thereon. The first silicon layer 20 may be formed by a chemical vapor deposition process.

Referring to FIG. 8, the first silicon layer 20 is patterned to form a diaphragm 120, an anchor 130, vent holes 122 and path members 125 (at S130). Further, the anchor 130 may be formed in the anchor hole 152 and may make contact with the substrate 110.

The path members 125 are formed on inner sidewalls of the path holes, respectively. Portions of the first insulation layer 20, which remains on bottom surfaces of the path holes, may be further removed to form the path members 125 on the sidewalls of the path holes 154.

An anisotropic etch process may be performed against the first insulation layer 20 to form the path members 125.

Prior to patterning the first silicon layer 20, impurities may be doped into the vibration area VA of the first silicon layer 20 through an ion implantation process to form the diaphragm 120 having a relatively low resistance in the vibration area VA.

Further, while forming the diaphragm 120 through the ion implantation process, a diaphragm pad 182 may be formed on the first insulation layer 150 and in the peripheral area SA to be electrically connected to the diaphragm 120.

A sacrificial layer (not shown) is formed on the first insulation layer 150 to cover the diaphragm 120, the anchor 130 and the path members 125 (at S140).

A second silicon layer is formed on the sacrificial layer and the second silicon layer is patterned to form a back plate 140 having dimple holes 144 in the vibration area VA (at S150). A back plate pad 184 may be formed in the peripheral area SA as well.

Further, the back plate 140 and the back plate pad 184 may be doped with impurities through an ion implantation process. The sacrificial layer and the first insulation layer 150 are patterned to form a chamber hole (not shown) to partially expose an upper face of the substrate 110 in the peripheral area SA.

A second insulation layer 160 is formed on the sacrificial layer to cover the back plate 140 (at S160).

Even though not shown in detail in drawings, a method of manufacturing a MEMS microphone according to an embodiment of the present invention can include forming the second insulation layer (at S160), and patterning the second insulation layer 160 and the sacrificial layer to form a first contact hole CH1 to expose the diaphragm pad 182. The second insulation layer 160 can also be patterned to form a second contact hole CH2 to expose the back plate pad 184. Further, a first pad electrode 192 and a second pad electrode 194 may be formed on the second insulation layer 160 through which the first and second contact holes CH1 and CH2 are formed.

The second insulation layer 160 and the back plate 140 are patterned to form the acoustic holes 142 through the second insulation layer 160 and the back plate 140 (at S170).

Subsequently, the substrate 110 is patterned to form a cavity 112 in the vibration area VA (at S180).

An etchant can be supplied to the first insulation layer 150 through the cavity 112 and the cavity extending portion 116 to remove a portion of the first insulation layer 150, located under the diaphragm 120. Only a portion of the second insulation layer 160 located outside the chamber portion 162 remains (at S200).

Subsequently, a portion of the sacrifice layer, located over the diaphragm 120 and the anchor 130 is removed to form the air gap AG. The vent holes 122 of the diaphragm 120 may serve as a flow path of the etchant for removing the portion of the sacrificial layer. The first insulation layer and the sacrificial layer may be simultaneously removed.

When forming the air gap AG, only a portion of the sacrificial layer existing outside the chamber 162 remains, and a remaining portion is converted into an insulating interlayer 170. As a result, a MEMS microphone 101 shown in FIGS. 1 and 2 may be completely manufactured.

Figure 9:
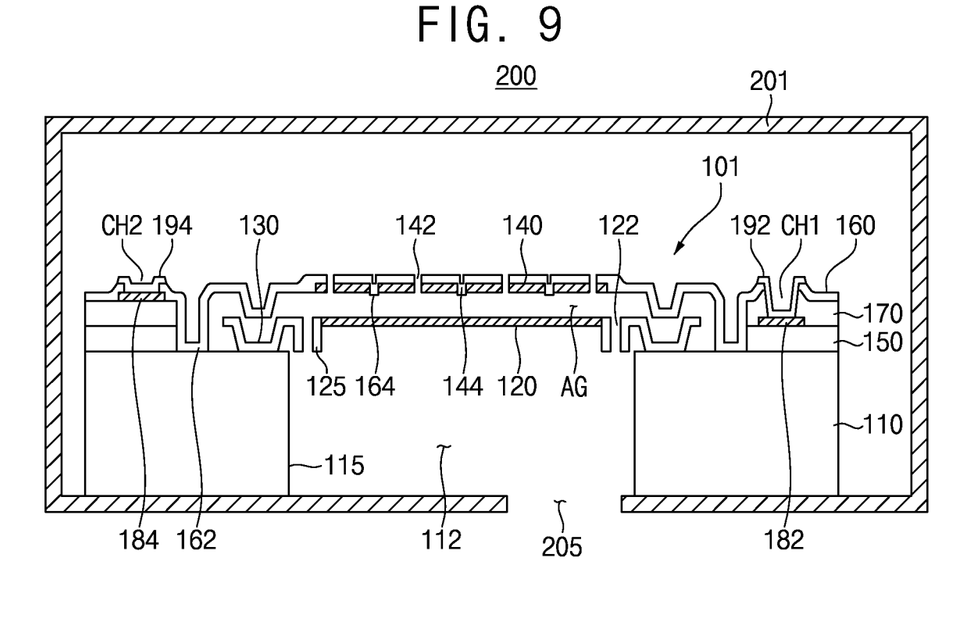
FIG. 9 is a cross sectional view illustrating a MEMS microphone package in accordance with an embodiment of the present invention.

FIG. 9 is a cross sectional view illustrating a MEMS microphone package in accordance with an example embodiment of the present invention.

Referring to FIG. 9, a MEMS microphone package 200 according to an embodiment of the present invention further includes a package portion 201 surrounding the MEMS microphone 101.

The package portion 201 has a bottom port 205 through which an acoustic pressure may flow. That is, the acoustic pressure may be introduced through the top port 205 and applied to the MEMS microphone 101.

Although the MEMS microphone, the method of manufacturing the MEMS microphone and the MEMS microphone package have been described with reference to the specific embodiments, they are not limited thereto. Therefore, it will be readily understood by those skilled in the art that various modifications and changes can be made thereto without departing from the spirit and scope of the appended claims.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein. This application incorporates by reference the contents of U.S. patent application Ser. No. 16/403,074 (filed on May 3, 2019, by D B Hitek Co., Ltd.)

For purposes of interpreting the claims, it is expressly intended that the provisions of 35 U.S.C. § 112(f) are not to be invoked unless the specific terms "means for" or "step for" are recited in a claim.

What is claimed is:

1. A MEMS microphone comprising:
a substrate defining a cavity including a first sidewall extending a vertical direction;
a back plate disposed over the substrate and defining a plurality of acoustic holes;
a diaphragm disposed between the substrate and the back plate, the diaphragm being spaced apart from the substrate and the back plate and covering the cavity, the diaphragm defining at least one vent hole, and being configured to sense an acoustic pressure to generate a corresponding displacement;
an anchor extending from a circumference of the diaphragm to connect an end portion of the diaphragm to an upper surface of the substrate, the anchor being connected with the upper surface of the substrate to support the diaphragm; and
at least one path member communicating with the vent hole, the path member providing a flow path for the acoustic pressure to flow downwardly toward the cavity,
wherein the anchor is positioned on an upper surface of the substrate and circumscribes the cavity, and
the path member is disposed on an inner sidewall of a penetration hole which penetrates through the substrate, and the path member extends along the inner sidewall to be connected to the anchor.

2. The MEMS microphone of claim 1, wherein the substrate further includes a cavity extending portion extending outwardly from a center line thereof.

3. The MEMS microphone of claim 2, wherein the cavity extending portion communicates with the path member.

4. A MEMS microphone package comprising:
a substrate defining a cavity with a first sidewall extending a vertical direction;
a back plate disposed over the substrate and defining a plurality of acoustic holes;
a diaphragm disposed between the substrate and the back plate, the diaphragm being spaced apart from the substrate and the back plate to cover the cavity, the diaphragm having at least one vent hole, and being configured to sense an acoustic pressure to generate a corresponding displacement;
an anchor extending from a circumference of the diaphragm to connecting an end portion of the diaphragm to an upper surface of the substrate, the anchor being connected with the upper surface of the substrate to support the diaphragm;
at least one path member communicating with the vent hole, the path member providing a flow path for the acoustic pressure to flow downwardly toward the cavity; and
a package portion entirely surrounding the substrate, the back plate, the diaphragm, the anchor and the path member, the package portion including a bottom port which provides a flow path for an acoustic pressure,
wherein the anchor is positioned on an upper surface of the substrate and circumscribes the cavity, and
the path member is disposed on an inner sidewall of a penetration hole which penetrates through the substrate, and the path member extends along the inner sidewall to be connected to the anchor.

5. The MEMS microphone package of claim 4, wherein the substrate further includes a cavity extending portion extending outwardly from a center line thereof.

6. The MEMS microphone package of claim 5, wherein the cavity extending portion communicates with the path member.

* * * * *